(12) United States Patent
Ruan et al.

(10) Patent No.: US 11,837,948 B2
(45) Date of Patent: *Dec. 5, 2023

(54) DYNAMIC SIGNAL SLOPE COMPENSATION

(71) Applicant: TEXAS INSTRUMENTS INCORPORATED, Dallas, TX (US)

(72) Inventors: Jiancong Ruan, Shenzhen (CN); Runqin Tan, Shenzhen (CN); Zhicheng Hu, Shenzhen (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/896,122

(22) Filed: Aug. 26, 2022

(65) Prior Publication Data

US 2022/0416646 A1   Dec. 29, 2022

Related U.S. Application Data

(62) Division of application No. 16/560,149, filed on Sep. 4, 2019, now Pat. No. 11,462,991.

(60) Provisional application No. 62/807,140, filed on Feb. 18, 2019.

(51) Int. Cl.
*H02M 1/14* (2006.01)
*H03K 5/12* (2006.01)
*H02M 1/00* (2006.01)

(52) U.S. Cl.
CPC .............. *H02M 1/143* (2013.01); *H03K 5/12* (2013.01); *H02M 1/0029* (2021.05)

(58) Field of Classification Search
CPC . H02M 1/143; H02M 2001/0029; H03K 5/12
See application file for complete search history.

(56) References Cited

U.S. PATENT DOCUMENTS

| 3,908,173 A | 9/1975 | Murdock |
| 10,019,119 B2 | 10/2018 | Rebeschi |
| 2015/0069986 A1 | 3/2015 | Yanagida |
| 2015/0171932 A1* | 6/2015 | Khandelwal ......... H03K 5/1536 455/41.1 |
| 2015/0311801 A1* | 10/2015 | Causse .................. H02M 3/158 323/282 |
| 2018/0123838 A1 | 5/2018 | Lu |
| 2018/0331624 A1 | 11/2018 | Pullen |
| 2019/0296641 A1 | 9/2019 | de Cremoux |

* cited by examiner

*Primary Examiner* — Patrick C Chen
(74) *Attorney, Agent, or Firm* — Ray A. King; Frank D. Cimino

(57) ABSTRACT

Some aspects of the present disclosure provide for a circuit. In at least some examples, the circuit includes an integrator coupled between a first node and a second node and a filter coupled between the second node and a third node. The circuit further includes a buffer coupled between the third node and a fourth node and a first switch coupled between the fourth node and a fifth node. The circuit further includes a first capacitor coupled between the fifth node and a ground node, a first resistor comprising a first terminal coupled to the fifth node and a second terminal, a second switch coupled between the second terminal of the first resistor and the ground node.

10 Claims, 8 Drawing Sheets

DYNAMIC SIGNAL SLOPE COMPENSATION

CROSS-REFERENCE TO RELATED APPLICATIONS

The present application is a division of U.S. patent application Ser. No. 16/560,149, filed Sep. 4, 2019, which claims priority to U.S. Provisional Patent Application No. 62/807,140, which was filed Feb. 18, 2019, and both are hereby incorporated herein by reference in their entirety.

BACKGROUND

In some examples, a power converter (such as a direct current (DC) to DC converter) receiving a clock signal (CLK) initiates a new switching cycle (or simply, cycle) at each rising edge of CLK. Alternatively, some power converters may initiate a new cycle at each falling edge of CLK. For one portion of the cycle, a feedback voltage (VFB) representative of an output of the power converter increases in value and for another portion of the cycle VFB decreases in value. When VFB reaches a value of a reference voltage (VREF), the power converter changes states, either from on to off or vice versa. For example, in a peak ripple mode power converter, the power converter is turned on (e.g., energizing an inductor) from a time at which a rising edge of CLK is received until VFB plus a ripple voltage (Vripple) reaches VREF and the power converter is turned off until the next rising edge of CLK is received. Vripple is another feedback signal that, in some examples, can generate a zero to cancel double poles in a signal (e.g., such that the zero cancels or negates one or more frequencies resulting from the double poles). In some examples, when a duty cycle of the power converter is greater than about fifty percent, and the power converter is a fixed frequency peak mode power converter, sub-harmonic oscillation can be created and/or introduced into VFB. The sub-harmonic oscillation is created, in at least some examples, when the inductor of the power converter does not return to its initial value (e.g., zero, or fully de-energize) by the start of a next switching cycle (e.g., a next rising edge in CLK). Failing to mitigate the sub-harmonic oscillation, in at least some examples, can lead to VFB noise that is amplified cycle by cycle and can cause irregular inductor current that can cause system instability.

SUMMARY

Aspects of the present disclosure provide for a circuit. In at least some examples, the circuit includes an integrator coupled between a first node and a second node and a filter coupled between the second node and a third node. The circuit further includes a buffer coupled between the third node and a fourth node and a first switch coupled between the fourth node and a fifth node. The circuit further includes a first capacitor coupled between the fifth node and a ground node, a first resistor comprising a first terminal coupled to the fifth node and a second terminal, a second switch coupled between the second terminal of the first resistor and the ground node.

Other aspects of the present disclosure provide for a circuit. In at least some examples, the circuit includes an integrator configured to integrate a switch signal present at a switching node of a power converter to generate a current sense positive signal and a filter coupled to the integrator and configured to filter the current sense positive signal to generate a current sense negative signal at a first node. The circuit further includes a buffer coupled between the first node and a second node to replicate the current sense negative signal at the second node as a positive slope signal. The circuit further includes a first switch coupled between the second node and a third node and a first capacitor coupled between the third node and a ground node and configured to charge to a value of the current sense negative signal when the first switch is closed. A signal present at the third node is a negative slope signal. The circuit further includes a first resistor coupled via a second switch between the third node and the ground node. When the first switch is open and the second switch is closed, a slope compensation signal is generated according to a difference between the positive slope signal and the negative slope signal.

Other aspects of the present disclosure provide for a system. In at least some examples, the system includes a power converter, a controller, and a slope compensation circuit. The power converter comprises a high-side field effect transistor (FET) comprising a gate terminal, a drain terminal configured to couple to a power supply, and a source terminal coupled to a first node. The controller is configured to receive a feedback voltage of the power converter, receive a reference voltage for regulating the power converter, receive a ripple voltage signal, and receive a slope compensation signal. The controller is further configured to generate a control signal on which control of the high-side FET is based at least partially according to the feedback voltage and the reference voltage. The slope compensation circuit is configured to generate a slope compensation signal. The slope compensation circuit comprises an integrator configured to integrate a switch signal present at the first node to generate a current sense positive signal and a filter coupled to the integrator and configured to filter the current sense positive signal to generate a current sense negative signal at a second node. The slope compensation circuit further includes a buffer coupled between the second node and a third node to replicate the current sense negative signal at the third node as a positive slope signal and a first switch coupled between the third node and a fourth node. The slope compensation circuit further includes a first capacitor coupled between the fourth node and a ground node and configured to charge to a value of the current sense negative signal when the first switch is closed and a first resistor coupled via a second switch between the fourth node and the ground node. A signal present at the fourth node is a negative slope signal. When the high-side FET is in a conductive state the first switch is open, the second switch is closed, and the slope compensation signal is generated according to a difference between the positive slope signal and the negative slope signal when the first capacitor discharges through the first resistor.

BRIEF DESCRIPTION OF THE DRAWINGS

For a detailed description of various examples, reference will now be made to the accompanying drawings in which.

DETAILED DESCRIPTION

Some circuit architectures implement both peak control and valley control schemes to mitigate the creation of the sub-harmonic oscillation. However, this solution can be undesirable due to complexity of circuit implementation, size of the resulting circuit, cost of the resulting circuit, etc. Additionally, frequent transitions between the control schemes when the power converter operates at approximately fifty percent duty cycle can induce undesirable harmonics and/or create difficulty in implementing fixed frequency valley control in a power-efficient manner when operating under light load conditions.

Aspects of the present disclosure provide for a circuit for at least partially mitigating the generation of sub-harmonic oscillation. In some examples, the circuit generates a voltage signal (Vcomp) having a slope dependent on (e.g., generated based on and proportional to) a slope of a ripple voltage (Vripple), such that the slope of Vcomp is determined independent of an input voltage (VIN), output voltage (VOUT) duty cycle, temperature, and/or component process variation (e.g., semiconductor process corners). Vcomp, in at least some examples, such as when added to or combined with Vripple, mitigates the generation of sub-harmonic oscillation. However, if Vcomp is too small in value it will not fully mitigate the generation of sub-harmonic oscillation. Additionally, if Vcomp is too large in value it will slow transient response of a circuit and may introduce an electrical pole in the circuit. In some examples, to prevent Vcomp from having a value too small or too large in value, Vcomp is implemented according to a smart slope compensation scheme. In some examples of a smart slope compensation scheme, Vcomp maintains a substantially constant value with respect to a falling slope of Vripple (e.g., such that a Vcomp to Vripple ratio remains approximately constant in value). In at least some examples, Vcomp is generated based on a switched resistor-capacitor (RC) circuit that charges based on Vripple and discharges to provide Vcomp for the slope compensation.

Figure 1:
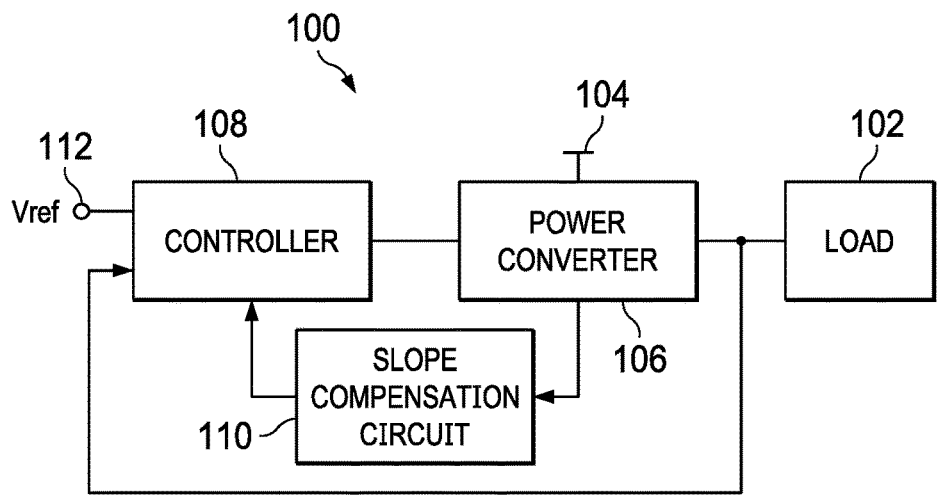
FIG. 1 shows a block diagram of an illustrative power delivery system in accordance with various examples.

Turning now to FIG. 1, a block diagram of an illustrative power delivery system 100 is shown. In at least some examples, the system 100 is representative of an electronic device, such as a consumer electronic device or an enterprise electronic device, that receives VIN and generates VOUT to power one or more components of the system 100, such as a load 102. The load 102 is, in various examples, a processor or other circuit(s) capable of performing processing and/or executing operations to perform a desired function, process an input, and/or generate an output, a sensor, a transmitter, a memory or other storage device, or any other circuit or component that receives VOUT to facilitate operation of the circuit or component. In at least some examples, the system 100 includes, or is configured to couple to, the load 102. The system 100 further includes, or is configured to couple to, a power supply 104. The system 100 further includes a power converter 106, a controller 108, and a slope compensation circuit 110. In at least some examples, the power converter 106 includes one or more components that are configured to couple to the system 100 and may not be included within the system 100 (e.g., not implemented or included on a same die as at least some other components of the power converter 106).

In some examples, the controller 108 is configured to receive a reference voltage (VREF) at a node 112, receive an output of the compensation circuit, and receive a feedback voltage (VFB). While shown as being received directly from an output node of the power converter 106 (e.g., at which VOUT is present), in at least some examples VFB is instead received from a node of another circuit such that VFB is representative of VOUT. For example, VFB may be received from a node that is a midpoint of a voltage divider (not shown) coupled between the output of the power converter 106 and a ground node or terminal (not shown). The controller 108 is configured to output one or more control signals to the power converter 106 for controlling one or more components of the power converter 106 to cause VOUT to be generated based on VIN received from the power supply 104 and output to the load 102. The slope compensation circuit 110 is configured to receive one or more input signals from the power converter 106 and output one or more signals to the controller 108. Additionally, while certain couplings in the system 100 are illustrated by single lines, in implementation the single lines are representative of any number of one or more couplings existing between the respective components illustrated. For example, the controller 108 may include multiple couplings to the power converter 106, the power converter 106 may include multiple couplings to the slope compensation circuit 110, the slope compensation circuit 110 may include multiple couplings to the controller 108, etc.

In an example of operation of the system 100, the power converter 106 receives VIN and generates VOUT to power at least a portion of the load 102. The power converter 106 generates VOUT from VIN, in at least some examples, according to a switching technique in which a high-side switch (not shown) is placed in a conductive state and a low-side switch (not shown) is placed in a non-conductive state to cause an inductor (not shown) to charge or energize during a first portion of a switching cycle. During a second portion of the switching cycle the conductive states of the high-side switch and the low-side switch are reversed to cause the inductor to discharge or de-energize. Generally, VOUT increases in value as the inductor charges and decreases in value as the inductor discharges. Accordingly, an amount of time that the inductor is charging (and therefore an amount of time that the high-side switch is held in the conductive state) at least partially controls the value of VOUT.

The controller 108 controls the power converter 106 to generate VOUT. For example, the controller 108 controls operation of the high-side switch and the low-side switch such that the high-side switch is held in the conductive state based on a control signal received from the controller 108 having a first value and is held in the non-conductive state based on the control signal having a different value. Similarly, the low-side switch is held in the conductive state based on a second control signal received from the controller 108 having a first value and is held in the non-conductive state based on the second control signal having a different value. The controller 108 determines a value of the first control signal and/or the second control signal according to any suitable means and utilizing any circuit(s), component(s), or other hardware or software suitable for implementing those means of determination. For example, at least some implementations of the controller 108 perform peak control (e.g., such that the high-side switch is controlled to be held in the conductive state and the low-side switch in the non-conductive state until VFB+Vripple increases to reach VREF−Vcomp. When VFB+Vripple reaches VREF−Vcomp, conductive states of the high-side switch and the low-side switch are reversed for a set period of time). Other implementations of the controller 108 perform valley control (e.g., such that the high-side switch is controlled to be held in the non-conductive state and the low-side switch in the conductive state until VFB+Vripple decreases to reach VREF. When VFB+Vripple reaches VREF, the conductive states of the high-side switch and the low-side switch are reversed for a set period of time). This control of the high-side switch and the low-side switch by the controller generates VFB as a signal having a particular slope. However, as discussed above, in certain operational circumstances sub-harmonic oscillation is introduced into VFB and/or Vripple which can cause undesirable operation of the system 100.

To mitigate the creation of the sub-harmonic oscillation, either through prevention of, or compensation for, the creation of the sub-harmonic oscillation, the slope compensation circuit 110 generates Vcomp. Vcomp is, in some examples, generated based on Vripple such that Vcomp is dependent on, and proportional to, Vripple. For example, as discussed above, there can be difficulty in selecting a suitable slope for a fixed slope of Vcomp due to large variation in Vripple for different VIN, VOUT, process, and temperature values. To at least partially eliminate and/or mitigate this difficulty created by a fixed slope of Vcomp, Vcomp is dynamically generated according to Vripple. In this way, Vcomp has a rising slope that is proportional to, and tracks, a falling slope of Vripple. In at least some examples, a ratio of Vcomp to Vripple stays approximately consistent and unchanged for operation of the power converter 106 across a plurality of duty cycles, at least partially eliminating or mitigating the difficulty created by a fixed Vcomp. For example, when Vcomp has a slope greater than approximately one-half the slope of Vripple, the sub-harmonic oscillation issues discussed herein are at least partially mitigated.

Figure 2:
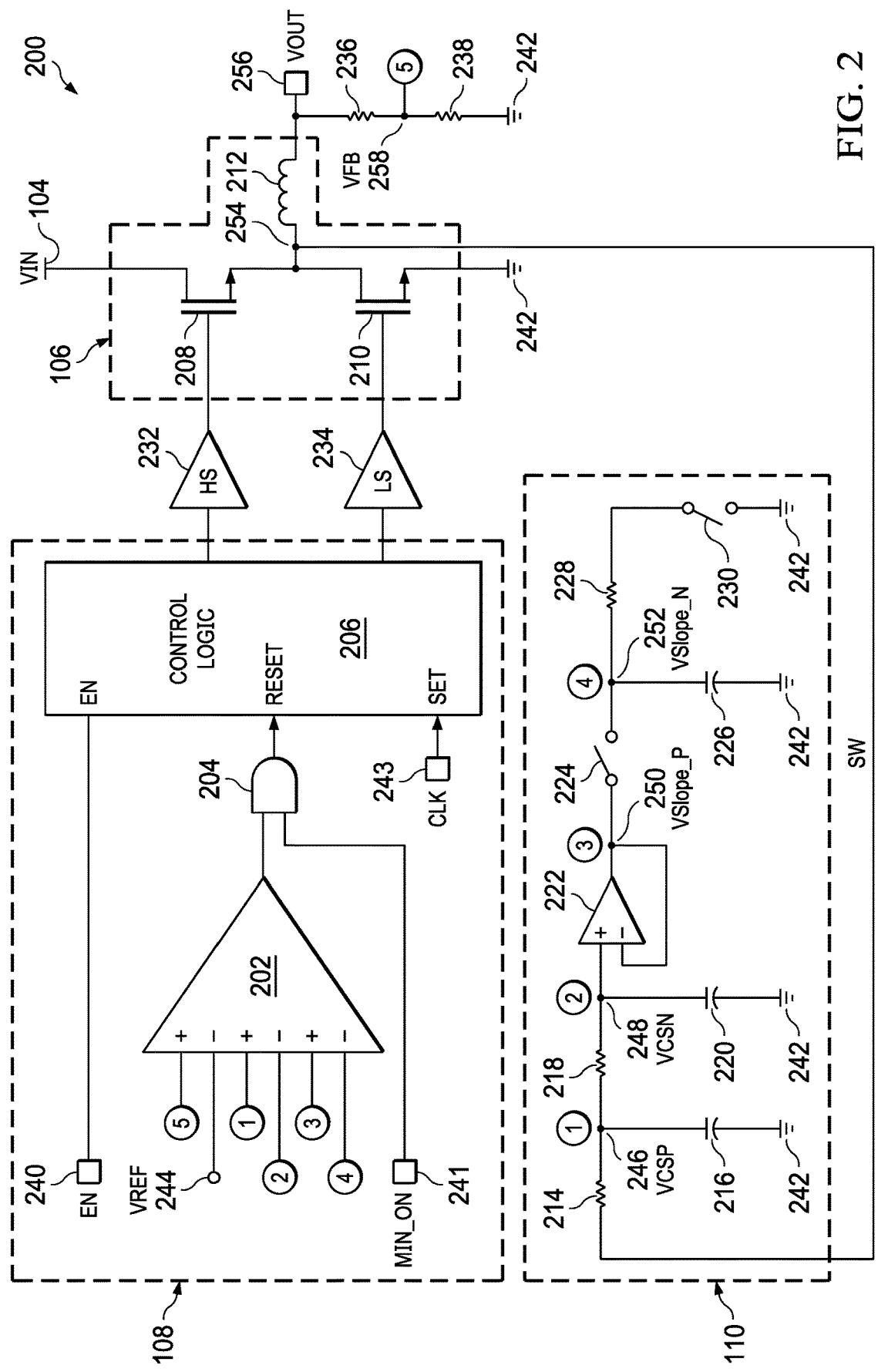
FIG. 2 shows a schematic diagram of an illustrative power delivery system in accordance with various examples.

Turning now to FIG. 2, a schematic diagram of an illustrative power delivery system 200 is shown. In at least some examples, the system 200 is representative of the system 100 of FIG. 1 at a schematic (e.g., component) level. Accordingly, in at least some examples the system 200 includes the controller 108, the power converter 106, and the slope compensation circuit 110. In at least some examples, the controller 108 includes a comparator 202, such as a summarized comparator. The summarized comparator outputs a logical high signal when a voltage sum of input signals received by the comparator is zero or greater (e.g., non-negative) and outputs a logical low signal when the sum of the input signals received by the comparator is negative. In this way the comparator 202 determines a difference between each received input pair (e.g., a difference between a first input and second input, a difference between a third input and fourth input, a difference between a fifth input and sixth input, etc.). The comparator 202 then determines a sum of those differences and generates an output signal based on that sum. In at least some examples, the controller 108 further includes a logic circuit 204, and control logic 206.

The power converter 106 includes a high-side (HS) field effect transistor (FET) 208, a low-side (LS) FET 210, and includes, or is configured to couple to, an inductor 212. The slope compensation circuit 110 includes a resistor 214, a capacitor 216, a resistor 218, a capacitor 220, a buffer 222, a switch 224, a capacitor 226, a resistor 228, and a switch 230. In at least some examples, the system 200 further includes a driver 232 and a driver 234. In other examples, although illustrated separately, the driver 232 and/or the driver 234 are included as components of the controller 108 and/or the power converter 106. Additionally, in at least some examples, although illustrated separately, the slope compensation circuit 110 is implemented as a component of the controller 108. Additionally, in at least some examples the system 200 further includes, or is configured to couple to, a resistor 236 and a resistor 238.

In various examples, the logic circuit 204 is any suitable component or components for outputting one or more control signals (e.g., such HS for controlling the high-side FET 208 and LS for controlling the low-side FET 210, where HS and LS are logical opposites) based on received input signals (e.g., based on values of signals received at the set input terminal and the reset input terminal, each of the control logic 206). In at least one example, the control logic 206 is a set-reset (SR) latch having an output terminal coupled to an input of the driver 232 and an inverter output terminal coupled to an input of the driver 234. Additionally, the buffer 222 is any suitable buffer architecture, for example, a unity gain amplifier.

In an example architecture of the system 200, the control logic 206 has an enable input terminal coupled to a node 240 at which an enable signal (EN) is received, a reset input terminal coupled to an output terminal of the logic circuit 204, and a set input terminal coupled to a node 243 and configured to receive a clock signal (CLK). A first output terminal of the control logic 206 is coupled to an input terminal of the driver 232 and a second output terminal of the control logic 206 is coupled to an input terminal of the driver 234. The logic circuit 204 has a first input terminal coupled to an output terminal of the comparator 202 and a second input terminal coupled to a node 241 at which a minimum on time (MIN_ON) signal is received to force a minimum on time of HS, and correspondingly the high-side FET 208. In at least some examples, the minimum on time is about 20 nanoseconds and MIN_ON is de-asserted for the minimum on time and asserted otherwise. In at least some examples, MIN_ON resets with each rising edge of CLK (e.g., such that a falling edge occurs in MIN_ON coinciding with a rising edge in CLK and a rising edge in MIN_ON occurs after the minimum on time has expired). The logic circuit 204 is, in some examples, any circuit suitable of performing an AND logical operation. The comparator 202 has a first input terminal coupled to a node 258 to receive VFB, and a second input terminal coupled to a node 244 and configured to receive VREF. The comparator 202 further has a third input terminal coupled to a node 246 and configured to receive a current sense positive signal (VCSP), and a fourth input terminal coupled to a node 248 and configured to receive a current sense negative signal (VCSN), where VCSP minus VCSN is approximately equal to Vripple. The comparator 202 further has a fifth input terminal coupled to a node 250 and configured to receive VSlope_P, and a sixth input terminal coupled to a node 252 and configured to receive VSlope_N, where Vcomp is approximately equal to VSlope_P minus VSlope_N and VSlope_P is approximately equal to VCSN).

The driver 232 has an output terminal coupled to a gate terminal of the high-side FET 208 and the driver 234 has an output terminal coupled to a gate terminal of the low-side FET 210. The high-side FET 208 has a drain terminal coupled to the power supply 104 and a source terminal coupled to a node 254. The low-side FET 210 has a drain terminal coupled to the node 254 and a source terminal coupled to a ground node 242. The inductor 212 is configured to couple between the node 254 and a node 256 at which VOUT is present. The resistor 236 is configured to couple between the node 256 and a node 258 at which VFB is present and the resistor 238 is configured to couple between the node 258 and the ground node 242. VFB, in at least some examples, is representative in value of VOUT, scaled according to resistance values of the resistor 236 and the resistor 238.

The resistor 214 is coupled between the node 254 and the node 246 at which VCSP is present, the capacitor 216 is coupled between the node 246 and the ground node 242, the resistor 218 is coupled between the node 246 and the node 248 at which VCSN is present, and the capacitor is coupled between the node 248 and the ground node 242. The buffer 222 has a first input terminal coupled to the node 248 and a second input terminal and an output terminal both coupled to the node 250 at which VSlope_P is present. The switch 224 is coupled between the node 250 and the node 252 at which VSlope_N is present. The capacitor 226 is coupled between the node 252 and the ground node 242, the resistor 228 has a first terminal coupled to the node 252 and a second terminal coupled through the switch 230 to the ground node 242. In at least some examples, the switch 224 and the switch 230 are controlled according to HS. For example, when HS is de-asserted (e.g., meaning that the high-side FET 208 is in a non-conductive state) the switch 224 is controlled to be closed, electrically coupling the node 250 to the node 252, and the switch 230 is controlled to be open, electrically de-coupling the second terminal of the resistor 228 from the ground node 242. When HS is asserted (e.g., meaning that the high-side FET 208 is in a conductive state) the switch 224 is controlled to be open, electrically de-coupling the node 250 from the node 252, and the switch 230 is controlled to be closed, electrically coupling the second terminal of the resistor 228 to the ground node 242. The switch 224 and the switch 230 are, in some examples, any suitable component or components capable of operation according to a switch as described in the present disclosure. In at least one example, the switch 224 and the switch 230 are each implemented as semiconductor devices, such as transistors. In at least one example, a control signal received by the switch 230 is a logical opposite or inversion of a control signal received by the switch 224.

In an example of operation, the system 200 includes two phases of operation. During a first phase, HS is de-asserted and LS is asserted such that the high-side FET 208 is non-conductive, the low-side FET 210 is conductive, the switch 224 is closed, and the switch 230 is open. Because the switch 224 is closed, charge present at the node 250 is passed to the capacitor 226 to charge the capacitor 226 until VSlope_N (the signal present at the node 252) reaches VCSN (the signal present at the node 248 and provided to the node 250 as VSlope_P by the buffer 222) in value. During the first phase of operation, slope compensation by the slope compensation circuit 110 is disabled. In at least some examples, the charge present at the node 250 is a result of the buffer 222, during a previous phase of operation, amplifying the signal present at the node 248 with a factor of one (e.g., substantially no change in value of the signal present at the node 248) and providing that amplified signal to the node 250. Because the buffer 222 does not substantially increase or decrease a value of the signal present at the node 248 before providing that signal to the node 250 the description of the present disclosure will refer to the node 250 as receiving the same signal that is present at the node 248.

During a second phase of operation, the control logic 206 receives a rising edge of CLK and controls HS to be asserted and LS to be de-asserted such that the high-side FET 208 is conductive, the low-side FET 210 is non-conductive, the switch 224 is open, and the switch 230 is closed. Further during the second phase of operation, the resistor 214 and the capacitor 216 form an integrator that integrates a value of a signal (SW) present at the node 254 to generate VCSP at the node 246 having a triangular waveform pattern. The resistor 218 and the capacitor 220 subsequently filter VCSP to generate VCSN at the node 248 and the buffer 222 provides VCSN to the node 250 for use as VSlope_P and charging the capacitor 226 during a next phase of operation. In at least some examples, a falling slope of Vripple is determined according to a value of resistance of the resistor 214 and VCSN. The resistor 218, in at least some examples, has a very large resistance value in comparison to that of the resistor 214 and therefore can be ignored in the determination of the falling slope of Vripple. Also during the second phase of operation, slope compensation by the slope compensation circuit 110 is enabled. For example, the capacitor 226 is discharged by the resistor 228 at a rate (e.g., signal slope) determined according to a value of resistance of the resistor 228 and VCSN to which the capacitor 226 was charged during the first phase of operation. A ratio of the slope of Vcomp to the slope of Vripple (e.g., such as the rising slope of Vcomp to the falling slope of Vripple), as discussed above, is determined according to a ratio of the resistance of the resistor 228 to the resistance of the resistor 214. In at least some examples, Vcomp is combined with VREF and Vripple is combined with VFB, each by the comparator 202. When the comparator 202 determines that a value of VFB+VCSP−VCSN has risen to approximately equal or exceed a value of VREF−VSlope_P+V_Slope_N, the comparator outputs an asserted signal. The asserted signal causes the logic circuit 204 to reset the control logic 206 after the minimum on time according to MIN_ON received at the node 241 has expired. When the logic circuit 204 resets the control logic 206, the control logic 206 de-asserts HS and asserts LS such that the high-side FET 208 is non-conductive and the low-side FET 210 is conductive. Additionally, the switch 224 is closed, the switch 230 is open, and the system 100 begins a next phase of operation that is functionally equivalent to the first phase of operation, as discussed above.

Figure 3A:
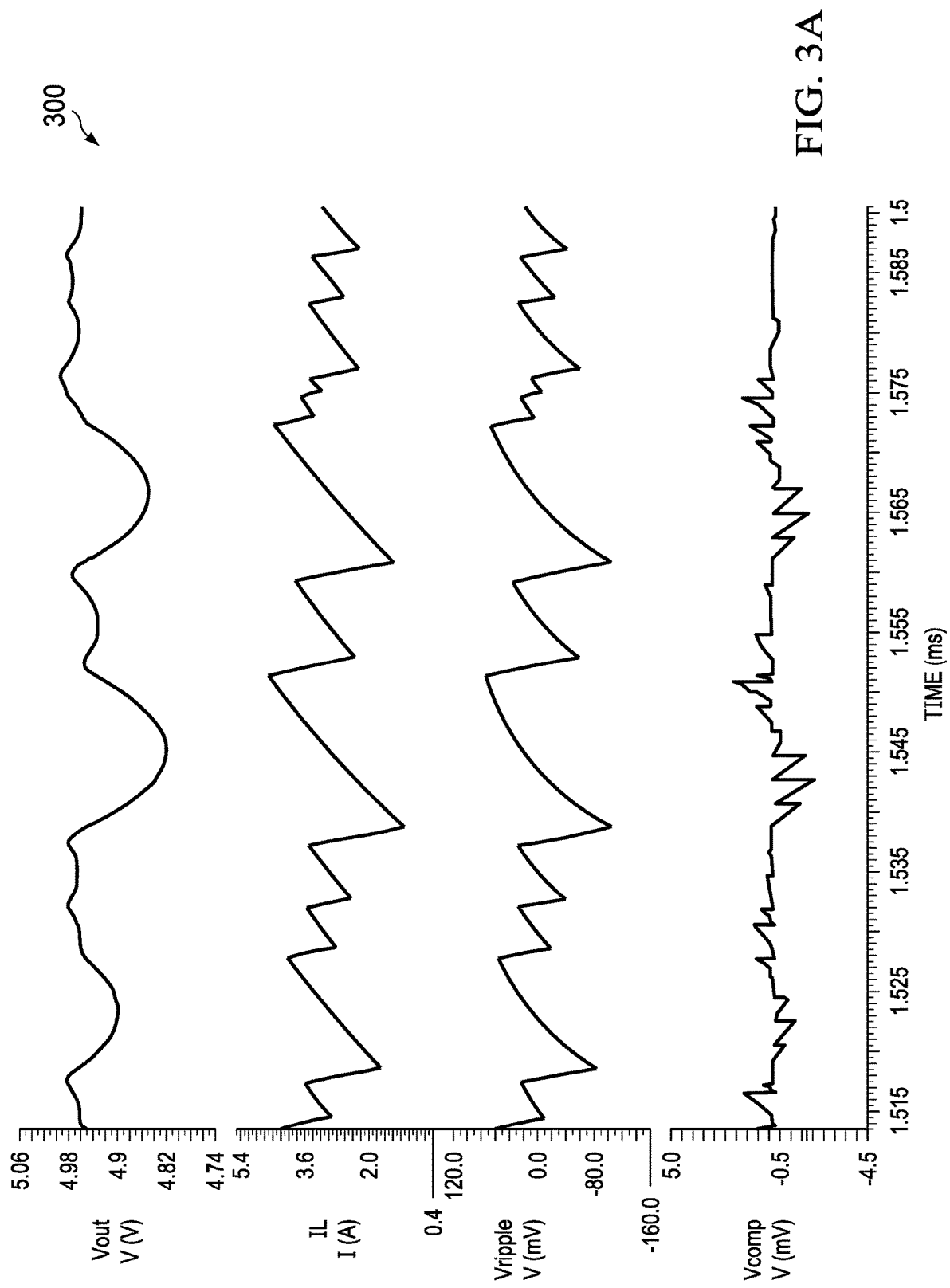
FIG. 3A shows a diagram of an illustrative signal waveforms in a power delivery system.
Figure 3B:
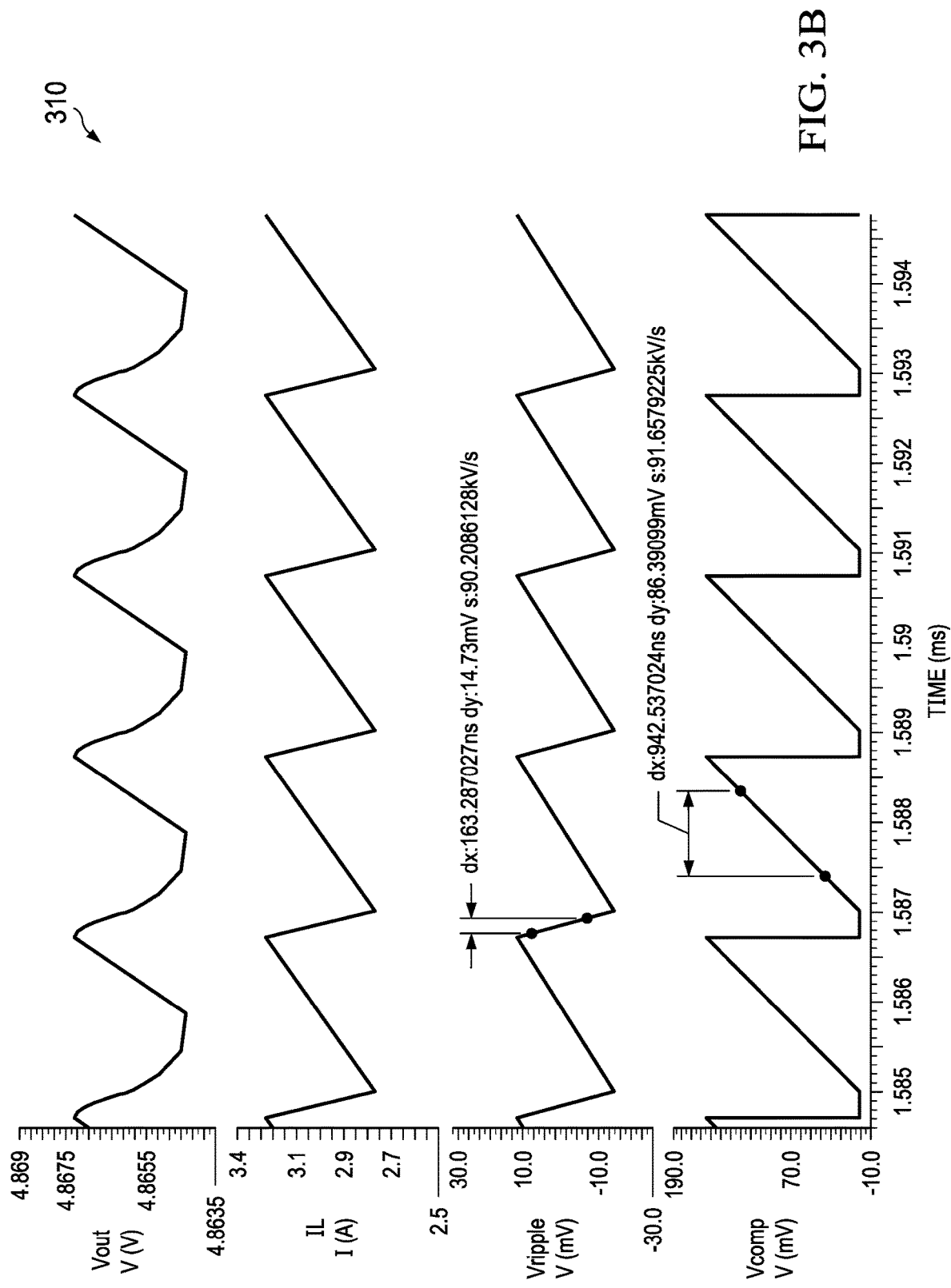
FIG. 3B shows a diagram of an illustrative signal waveforms in a power delivery system.

Turning now to FIGS. 3A and 3B, diagram 300 and diagram 310 of illustrative signal waveforms in a power delivery system are shown. The diagram 300 illustrates at least some signals present in a system such as the system 100 and/or system 200 in the absence of the slope compensation circuit 110. The diagram 310 illustrates at least some signals present in a system such as the system 100 and/or system 200 when including the slope compensation circuit 110 to mitigate sub-harmonic oscillation issues. The diagram 300 and the diagram 310 are representative of the system 100 and/or the system 200, according to the above descriptions, in which VIN is approximately equal to 6 volts (V), VOUT is approximately equal to 5 V, a duty cycle of operation is 83.3%, a switching frequency (e.g., frequency of SW) is about 500 kilohertz, the inductor 212 has an inductance of about 3.3 microhenries, and a capacitance present at the node 256 is about 44 microfarads.

As shown by the diagram 300, when no slope compensation is present in the system 100 and/or system 200 (e.g., as shown by Vcomp having no relation to Vripple), sub-harmonic oscillation occurs in an output current (IL), creating corresponding variation in VOUT and Vripple. Conversely, as shown by the diagram 310, when Vcomp is generated to maintain a slope proportional to, and greater than one half of, the slope of Vripple, the sub-harmonic oscillation in IL, and correspondingly VOUT and Vripple, is mitigated and the signals are stabilized.

Figure 4A:
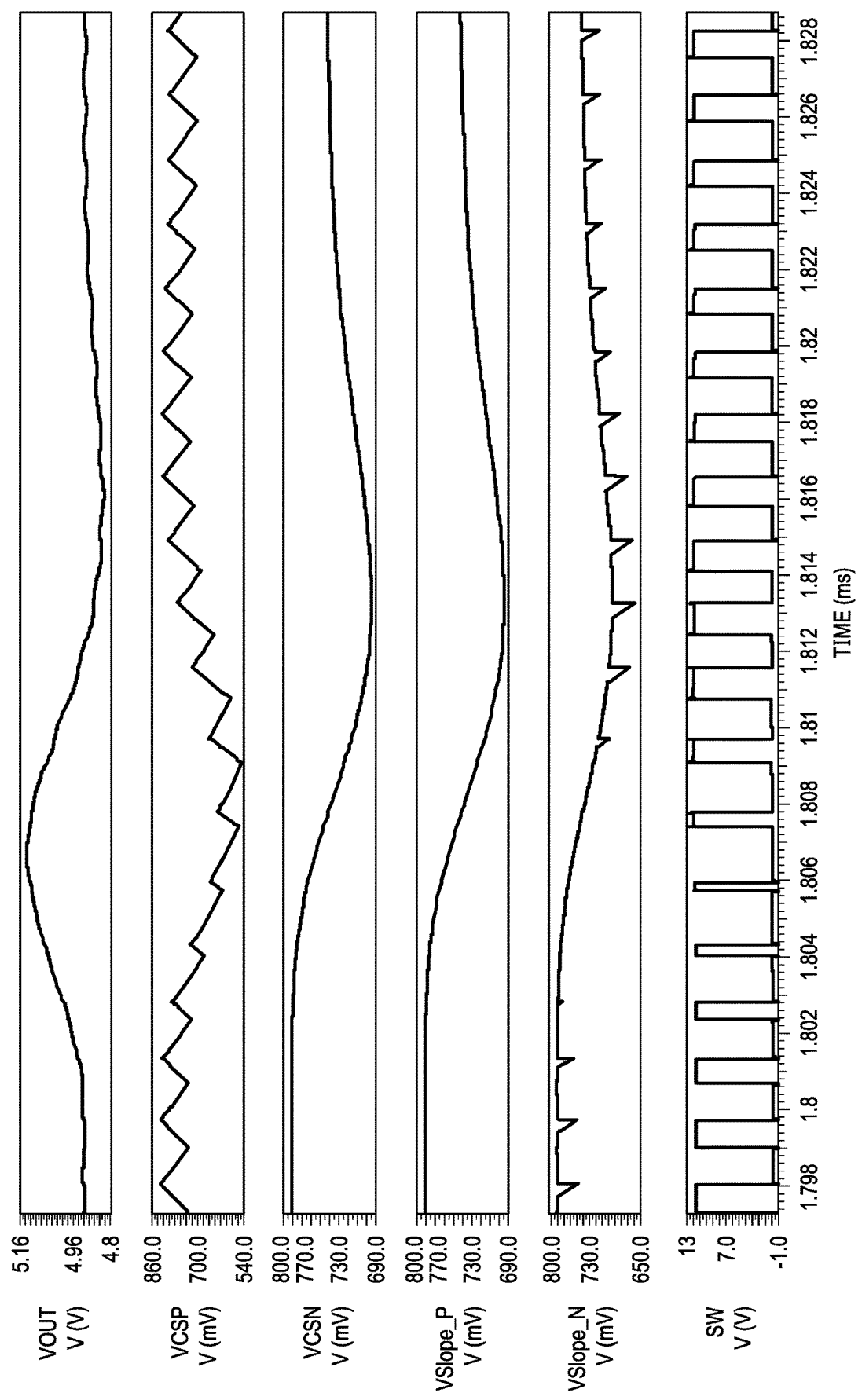
FIG. 4A shows a diagram of illustrative signal waveforms in a power delivery system.
Figure 4B:
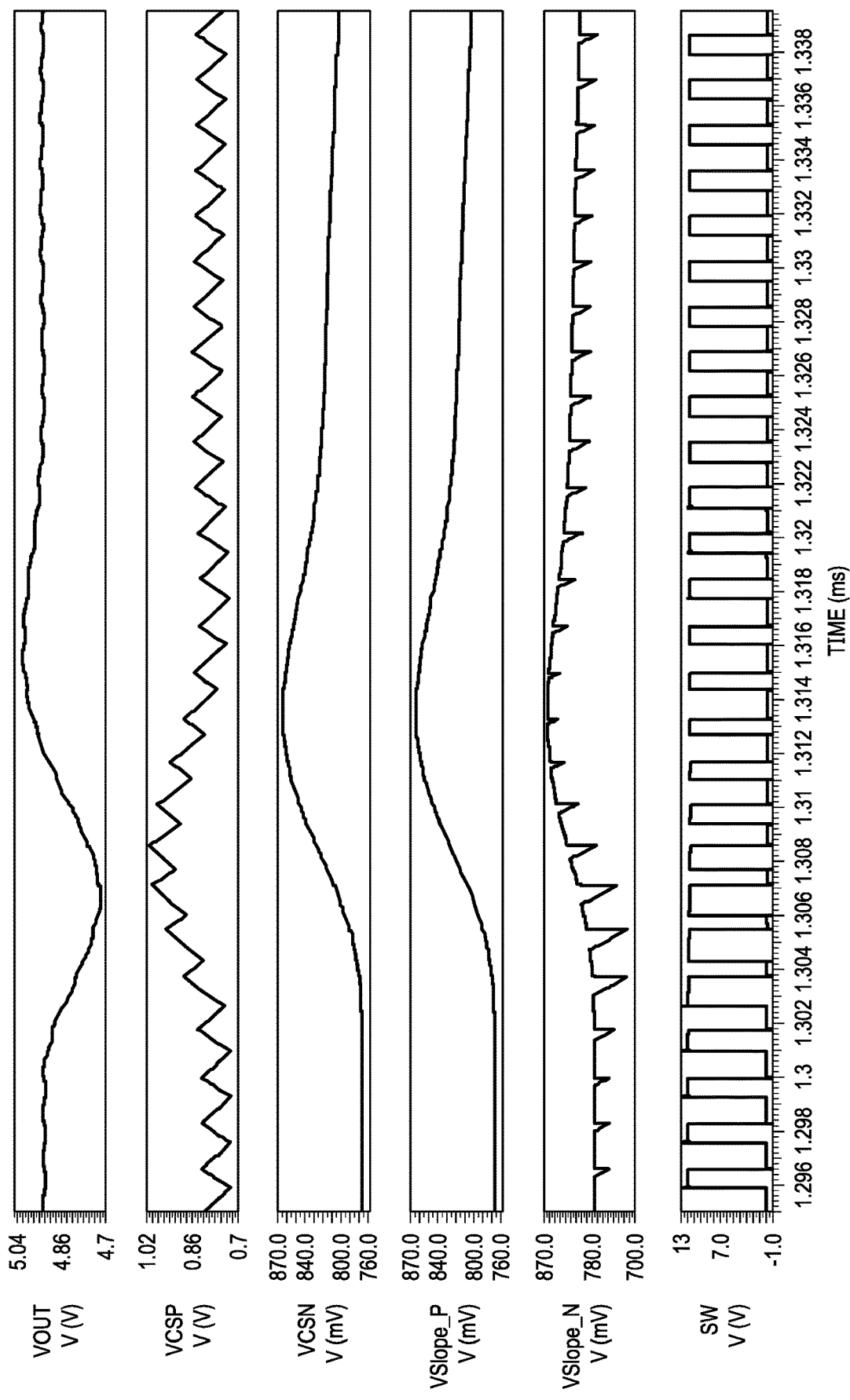
FIG. 4B shows a diagram of illustrative signal waveforms in a power delivery system.

Turning now to FIGS. 4A and 4B, diagrams of illustrative signal waveforms in a power delivery system are shown. FIGS. 4A and 4B are representative of at least some signals present in some implementations of the system 100 of FIG. 1 and/or system 200 of FIG. 2. Reference may be made to components of these systems in describing FIGS. 4A and 4B. For example, FIG. 4A illustrates at least some signals of the system 200 when load transients cause a momentary downward fluctuation in VOUT that is then corrected by the system 200 (e.g., by temporarily increasing a duty cycle of the power converter 106). Similarly, FIG. 4B illustrates at least some signals of the system 200 when load transients cause a momentary upward fluctuation in VOUT that is then corrected by the system 200 (e.g., by temporarily decreasing a duty cycle of the power converter 106).

As shown in FIGS. 4A and 4B, and as described in detail elsewhere herein, SW is integrated by the slope compensation circuit 110 to generate VCSP at the node 246. In at least some examples, VCSP is a substantially triangular waveform resulting from the integration of SW. A pulse width of SW increases when VOUT falls below a desired regulation point and decreases when VOUT rises above the desired regulation point. Subsequently, the slope compensation circuit 110 filters VCSP to generate VCSN at the node 248. The buffer 222 provides VCSN to the node 250 as VSlope_P, where VSlope_P is substantially equal to VCSN, as shown by FIGS. 4A and 4B. Subsequently, VSlope_N is generated according to VSlope_P and the charging and discharging of the capacitor 226 based on the phase of operation of the system 200, as discussed in greater detail above.

Figure 5A:
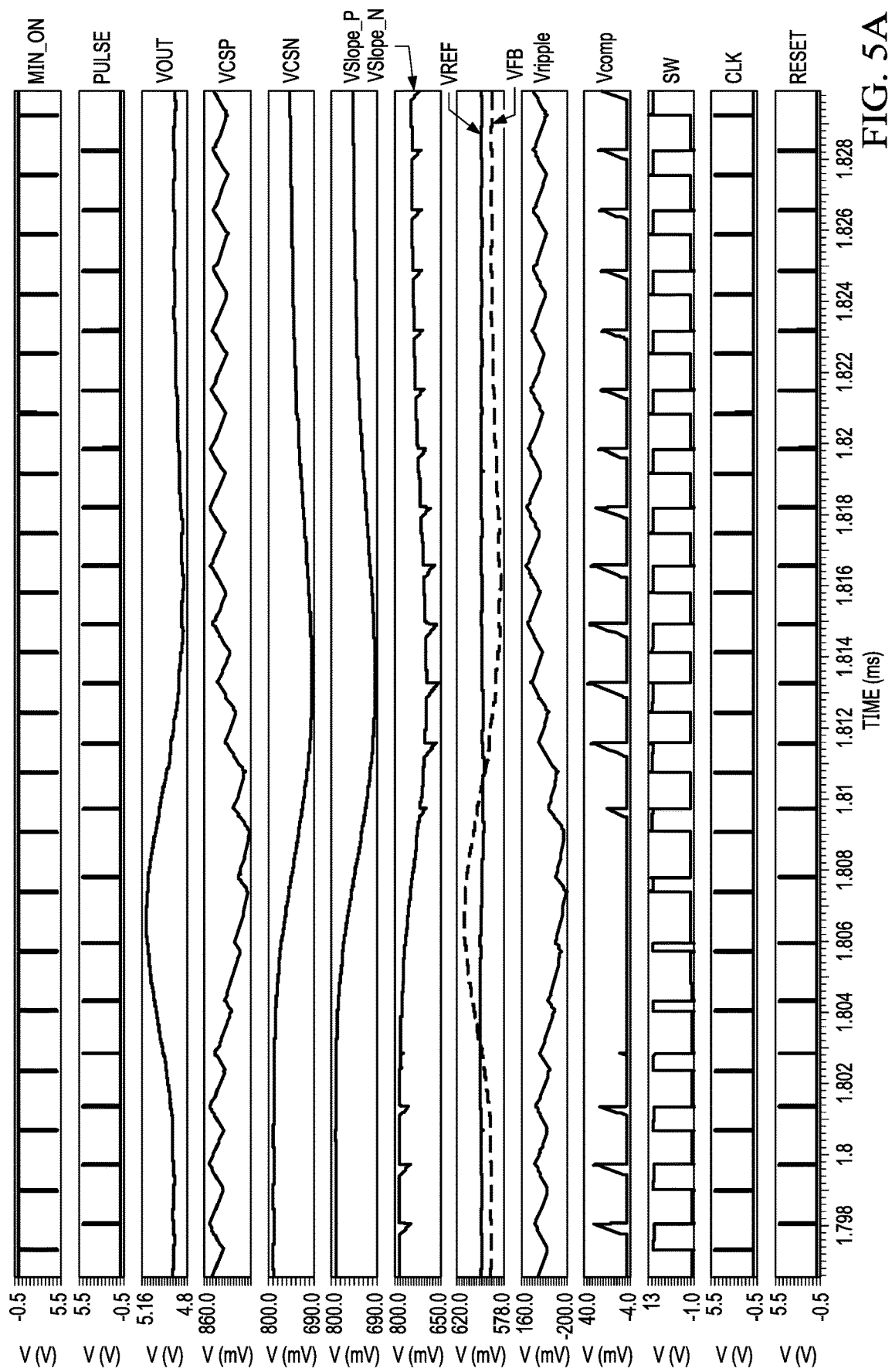
FIG. 5A shows a diagram of illustrative signal waveforms in a power delivery system.
Figure 5B:
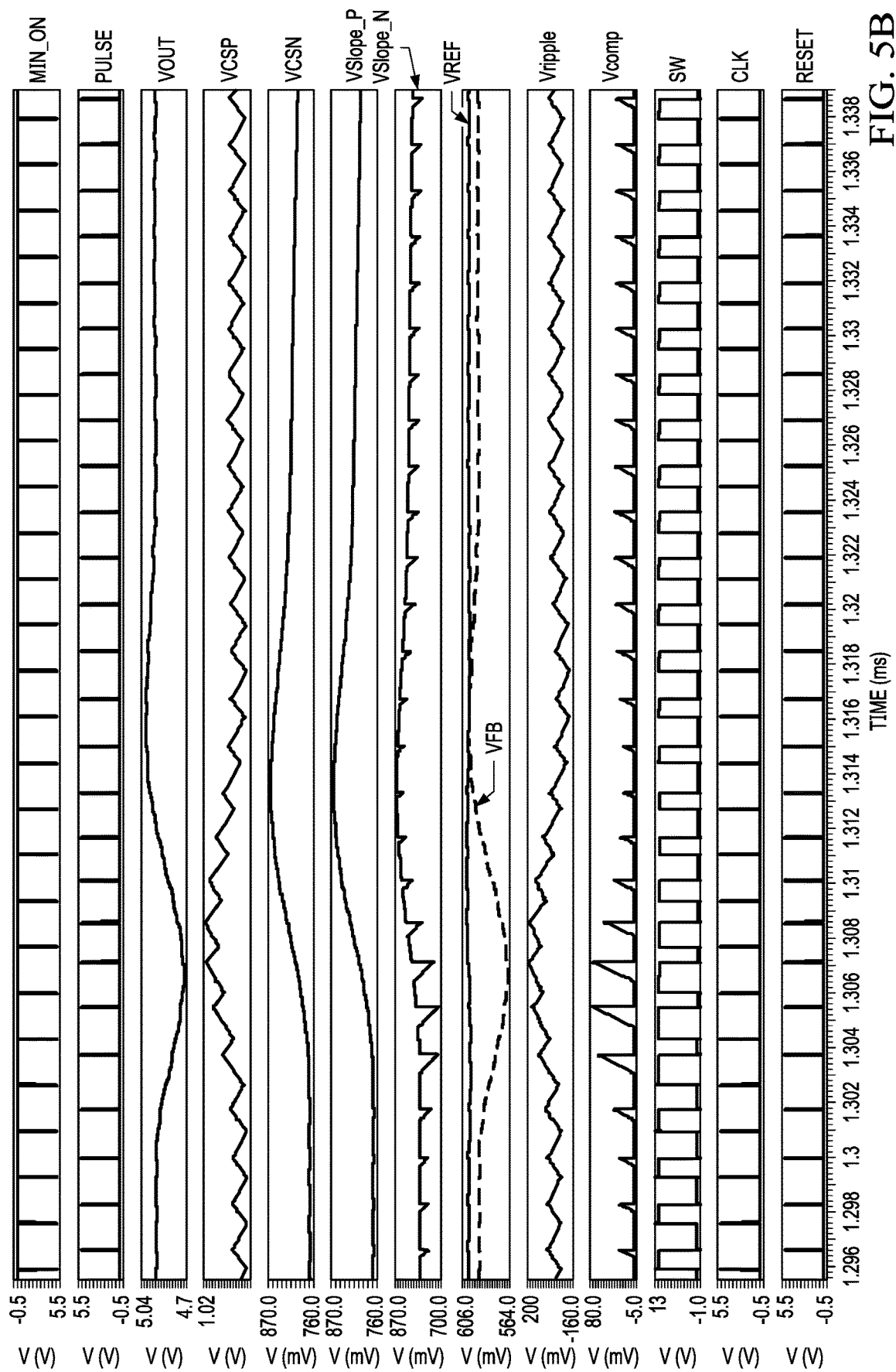
FIG. 5B shows a diagram of illustrative signal waveforms in a power delivery system.

Turning now to FIGS. 5A and 5B, diagrams of illustrative signal waveforms in a power delivery system are shown. FIGS. 5A and 5B are representative of at least some signals present in some implementations of the system 100 of FIG. 1 and/or system 200 of FIG. 2. Reference may be made to components of these systems in describing FIGS. 5A and 5B. For example, FIG. 5A illustrates at least some signals of the system 200 when load transients cause a momentary downward fluctuation in VOUT that is then corrected by the system 200 (e.g., by temporarily increasing a duty cycle of the power converter 106). Similarly, FIG. 5B illustrates at least some signals of the system 200 when load transients cause a momentary upward fluctuation in VOUT that is then corrected by the system 200 (e.g., by temporarily decreasing a duty cycle of the power converter 106). The signals VOUT, CSP, CSN, VSlope_P, VSlope_N, and SW can be understood to have the same general meaning and transient responses in FIGS. 5A and 5B as discussed above with respect to FIGS. 4A and 4B.

In at least some examples, FIGS. 5A and 5B further illustrate at least some signals associated with the comparator 202. For example, FIGS. 5A and 5B illustrate signals VFB, VREF, VCSP, VCSN, VSlope_P, and VSlope_N, which are input signals to the comparator 202. VFB is determined, in at least some examples, as a scaled representation of VOUT, such as an output of a voltage divider sourced by VOUT. When VFB+Vripple rises in value to approximately equal VREF−Vcomp, the comparator 202 outputs a pulse indicated in FIGS. 5A and 5B as PULSE having an asserted value. More generally, the comparator 202 outputs PULSE having an asserted value when VFB−VREF+VCSP−VCSN+VSlope_P−VSlope_N is equal to 0 or greater. Based on the definitions of Vcomp and Vripple provided above, the above relation for the comparator 202 outputting pulse can be abbreviated. For example, the comparator 202 outputs PULSE having an asserted value when VFB−VREF+Vripple+Vcomp is equal to zero or greater. In this way, the comparator 202 determines a difference between a plurality of received signal pairs, sums the differences, and outputs PULSE having a value determined according to that sum.

When the minimum on time indicated by MIN_ON has expired, as discussed in greater detail elsewhere herein, and PULSE is asserted, RESET is asserted. When RESET is asserted, SW is de-asserted by the control logic 206 until a pulse in CLK is received, at which time the control logic 106 re-asserts SW to begin a new switching cycle.

Figure 6:
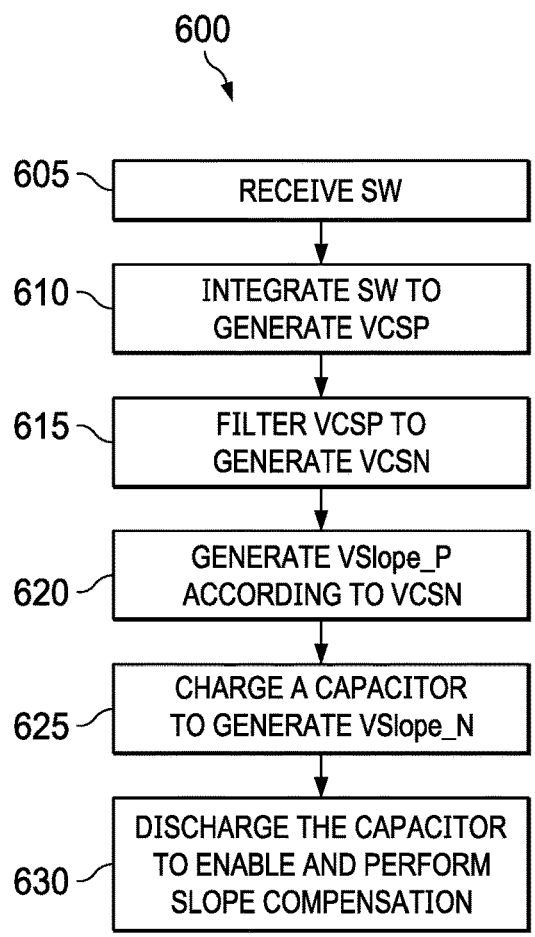
FIG. 6 shows a flowchart of an illustrative method in accordance with various examples.

Turning now to FIG. 6, a flowchart of an illustrative method 600 is shown. In at least some examples, the method 600 is a method of controlling a power converter and corresponds to one or more hardware components, circuits, devices, or systems disclosed here. For example, at least some portions of the system 100 and/or system 200, implement or perform one or more operations of the method 600.

At operation 605, SW is received. In at least some examples, SW is received from a power converter during a portion of a switching cycle in which a high-side FET is conductive. SW, in at least some examples, varies in value between approximately zero and approximately VIN (when VIN is the signal being switched by the power converter), and has a frequency indicative of a frequency at which the high-side FET is controlled to be either conductive or non-conductive.

At operation 610, SW is integrated to generate VCSP. SW is integrated, in at least one example, by an RC circuit. The operation 610, in at least some examples, is performed during the portion of the switching cycle in which the high-side FET is conductive. At operation 615, VCSP is filtered to generate VCSN. VCSP is filtered, in at least some examples, by a RC filter. The operation 615, in at least some examples, is performed during the portion of the switching cycle in which the high-side FET is conductive. In at least some examples, a difference between VCSP and VCSN determines Vripple, where Vripple has a falling edge slope determined according to a value of VCSN and a resistance value of a resistor of the RC circuit that integrates SW. In at least some other examples, Vripple is determined according to VCSP and VCSN and is combined with (e.g., added to) VFB, where VFB is proportional to VOUT of the power converter that generated SW.

At operation 620, VSlope_P is generated according to VCSN. The operation 620, in at least some examples, is performed during the portion of the switching cycle in which the high-side FET is conductive. In at least some examples, VSlope_P has a value approximately equal to VCSN, for example, such that VSlope_P is a buffered version of VCSN. At operation 625, a capacitor is charged to generate VSlope_N. The operation 625, in at least some examples, is performed during a portion of the switching cycle in which the high-side FET is non-conductive. In at least some examples, slope compensation is disabled in the method 600 until operation 630 at which the capacitor is discharged to enable and perform slope compensation for Vripple. The operation 630, in at least some examples, is performed during the portion of the switching cycle in which the high-side FET is conductive. In at least some examples, a difference between VSlope_P and VSlope_N determines Vcomp, where Vcomp has a falling edge slope determined according to a value of VSlope_N and a resistance value of a resistor through which the capacitor is discharged to enable the slope compensation. In at least some other examples, Vcomp is combined with (e.g., added to) VREF, where VREF is a received value for use in regulating a value of VOUT of the power converter that generated SW.

While the operations of the method 600 have been discussed and labeled with numerical reference, in various examples the method 600 includes additional operations that are not recited herein, in some examples any one or more of the operations recited herein include one or more sub-operations (e.g., such as intermediary comparisons, logical operations, output selections such as via a multiplexer, etc.). In some examples any one or more of the operations recited herein is omitted. In some examples any one or more of the operations recited herein is performed in an order other than that presented herein (e.g., in a reverse order, substantially simultaneously, overlapping, etc.). Each of these exemplary variations is intended to fall within the scope of the present disclosure.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A, A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

Mile certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A system, comprising:
a controller circuit having a compensation input and first and second controller outputs;
a first gate driver circuit having a first driver input and a first driver output, wherein the first driver input is coupled to the first controller output;
a second gate driver circuit having a second driver input and a second driver output, wherein the second driver input is coupled to the second controller output;
a power converter having first and second converter inputs, an inductor terminal, and a converter output, wherein the first converter input is coupled to the first driver output, and the second converter input is coupled to the second driver output; and
a slope compensation circuit that includes:
an amplifier having first and second amplifier inputs and an amplifier output, wherein the first amplifier input is coupled to the inductor terminal, and the second amplifier input is coupled to the amplifier output;
a first switch having first and second switch terminals, wherein the first switch terminal is coupled to the amplifier output;
a capacitor coupled between the second switch terminal and ground;
a resistor having first and second resistor terminals, wherein the first resistor terminal is coupled to the second switch terminal; and
a second switch coupled between the second resistor terminal and ground;
in which a slope compensation signal is provided to the compensation input, wherein the slope compensation signal is proportional to a difference between a signal at the first switch terminal and a signal at the second switch terminal.

2. The system of claim 1, wherein the slope compensation circuit further includes:
a first filter having a first filter input and a first filter output, wherein the first filter output is coupled to the first amplifier input; and
a second filter having a second filter input and a second filter output, wherein the second filter output is coupled to the first filter input.

3. The system of claim 2, wherein:
the resistor is a first resistor, and the capacitor is a first capacitor;

the first filter includes a second capacitor coupled between the first amplifier input and ground, and a second resistor coupled between the first amplifier input and the second filter output; and the second filter includes a third capacitor coupled between the second resistor and ground, and a third resistor coupled between the second resistor and the inductor terminal.

4. The system of claim 1, wherein a difference in value of a current sense positive signal provided at the first amplifier input and a current sense negative signal provided at the amplifier output is a ripple voltage of the power converter.

5. The system of claim 1, wherein the amplifier is a unity gain amplifier.

6. The system of claim 1, wherein the slope compensation signal mitigates sub-harmonic oscillation in an inductor current of the power converter responsive to the power converter operating in a constant frequency peak current control mode.

7. The system of claim 1, wherein the power converter includes:
a first transistor coupled between an input voltage terminal and the inductor terminal, and having a control terminal coupled to the first driver output;
a second transistor coupled between the inductor terminal and ground; and
an inductor coupled between the inductor terminal and the converter output.

8. The system of claim 7, wherein the first and second transistors are n-channel field effect transistors.

9. The system of claim 1, further comprising a voltage divider circuit coupled between the converter output and ground, wherein the voltage divider circuit has a voltage divider output coupled to an input of the controller circuit.

10. The system of claim 1, wherein the controller circuit includes:
a comparator having comparator inputs and a comparator output;
an AND gate having first and second AND inputs and an AND output, wherein the first AND input is coupled to the comparator output, and the second AND input is coupled to a minimum time input terminal; and
a control logic circuit having a reset input and first and second logic outputs, wherein the reset input is coupled to the AND output, the first logic output is coupled to the first driver input, and the second logic output is coupled to the second driver input.

\* \* \* \* \*